United States Patent
Koyama et al.

(10) Patent No.: US 8,284,092 B2
(45) Date of Patent: Oct. 9, 2012

(54) ANALOG/DIGITAL CONVERSION CIRCUIT

(75) Inventors: Yusaku Koyama, Tokyo (JP); Yasunari Harada, Tokyo (JP); Yoshio Hagihara, Tokyo (JP)

(73) Assignee: Olympus Corporation, Tokyo (JP)

( * ) Notice: Subject to any disclaimer, the term of this patent is extended or adjusted under 35 U.S.C. 154(b) by 77 days.

(21) Appl. No.: 12/892,163

(22) Filed: Sep. 28, 2010

(65) Prior Publication Data

US 2011/0210882 A1 Sep. 1, 2011

(30) Foreign Application Priority Data

Sep. 28, 2009 (JP) ................ 2009-221775

(51) Int. Cl.
H03M 1/50 (2006.01)
(52) U.S. Cl. ........................ 341/166; 341/157
(58) Field of Classification Search .............. 341/157, 341/166

See application file for complete search history.

(56) References Cited

U.S. PATENT DOCUMENTS

| | | | |
|---|---|---|---|
| 6,476,656 B2 * | 11/2002 | Dally et al. ............. | 327/276 |
| 6,653,964 B2 * | 11/2003 | Mizuno et al. ........... | 341/155 |
| 2007/0268172 A1 * | 11/2007 | Watanabe ................ | 341/155 |
| 2009/0316029 A1 * | 12/2009 | Hagihara ................ | 348/294 |

FOREIGN PATENT DOCUMENTS

JP 2003-032113 A 1/2003

OTHER PUBLICATIONS

Watanabe et al., An All-Digital Analog-to-Digital Converter With 12-_V/LSB Using Moving-Average Filtering, IEEE Journal of Solid-State Circuits, vol. 38, No. 1, Jan. 2003.*

Watanabe, T. et al "An All-Digital Analog-to-Digital Converter With 12-µV/LSB Using Moving-Average Filtering," IEEE Journal of Solid-State Circuits, vol. 38, No. 1, Jan. 2003, pp. 120-125.

* cited by examiner

*Primary Examiner* — Howard Williams
(74) *Attorney, Agent, or Firm* — Westerman, Hattori, Daniels & Adrian, LLP

(57) ABSTRACT

An analog-to-digital converter may include an annular delay circuit that includes a plurality of delay units connected in an annular shape, each of the plurality of delay units delaying a pulse current that is input to each of the plurality of delay units, a current source that outputs an electric current, in accordance with an input analog signal, to selected delay units, which is selected from among the plurality of delay units, and a digital signal generation unit that generates a digital signal in accordance with a number of circulations per predetermined period of time of the pulse current circulating around the annular delay circuit.

5 Claims, 13 Drawing Sheets

US 8,284,092 B2

ANALOG/DIGITAL CONVERSION CIRCUIT

BACKGROUND OF THE INVENTION

1. Field of the Invention

The present invention relates to an analog digital conversion circuit that converts an analog signal to a digital signal.

Priority is claimed on Japanese Patent Application No. 2009-221775, filed Sep. 28, 2009, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Time A/D converters (TADs) are one kind of pulse-delay-type analog-to-digital (A/D) converter circuit. A time A/D converter includes an annular delay circuit in which a plurality of delay units (such as inverting circuits) is connected in an annular shape.

In conventional time A/D converters, a pulse current is caused to circulate around the annular delay circuit while an input voltage as a target of A/D conversion is supplied to the power supply terminals of the delay units that constitute the annular delay circuit. Conventional time A/D converter performs A/D-conversion of the input voltage based on the number of circulations of the pulse current per predetermined period of time and on the "voltage-delay time" characteristic. Here, the "voltage-delay time" characteristic refers to a characteristic in which the higher the input voltage value to the power supply terminal of the delay unit is, the shorter the propagation delay time of the pulse current is.

A time A/D converter that performs A/D-conversion of an input voltage based on the "current-delay time" characteristic instead of the "voltage-delay time" characteristic is disclosed in Japanese Unexamined Patent Application, First Publication No. 2003-32113. Here, the "current-delay time" characteristic refers to a characteristic in which the higher the input current value to the power supply terminal of the delay unit is, the shorter the propagation delay time of the pulse current is.

In the time A/D converter based on the "current-delay time" characteristic, current control elements (control transistors) are connected to the delay units of the annular delay circuit (pulse delay circuit) on a one-to-one basis (FIG. 3($c$) of Japanese Unexamined Patent Application, First Publication No. 2003-32113). With the current control elements, the time A/D converter is capable of restricting a through current to suppress electric power consumption.

SUMMARY

An analog-to-digital converter may include an annular delay circuit that includes a plurality of delay units connected in an annular shape, each of the plurality of delay units delaying a pulse current that is input to each of the plurality of delay units, a current source that outputs an electric current, in accordance with an input analog signal, to selected delay units, which is selected from among the plurality of delay units, and a digital signal generation unit that generates a digital signal in accordance with a number of circulations per predetermined period of time of the pulse current circulating around the annular delay circuit.

The current source may output the electric current to all of the plurality of delay units.

The current source may select the selected delay units not adjacent to each other, and output the electric current to the selected delay units.

The annular delay circuit may include a plurality of delay circuits. Each of the plurality of delay circuits may include one of the plurality of delay units and the current source. Each of the plurality of delay circuits may be made of four transistors.

The plurality of delay units may include a first plurality of delay units and a second plurality of delay units. The current source may include a first PMOS element and a second PMOS element. The first PMOS element may output a first current to the first plurality of delay units. The second PMOS element may output a second current to the second plurality of delay units.

The plurality of delay units may include a first plurality of delay units and a second plurality of delay units. The current source may include a PMOS element and an NMOS element. The PMOS element may output a first current to the first plurality of delay units. The NMOS element may output a second current to the second plurality of delay units.

An analog-to-digital conversion method may include outputting an electric current, in accordance with an input analog signal, to some delay units selected from among a plurality of delay units included in an annular delay circuit, and generating a digital signal in accordance with a number of circulations per predetermined period of time of the pulse current circulating around the annular delay circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Preferred Embodiment

Figure 1:
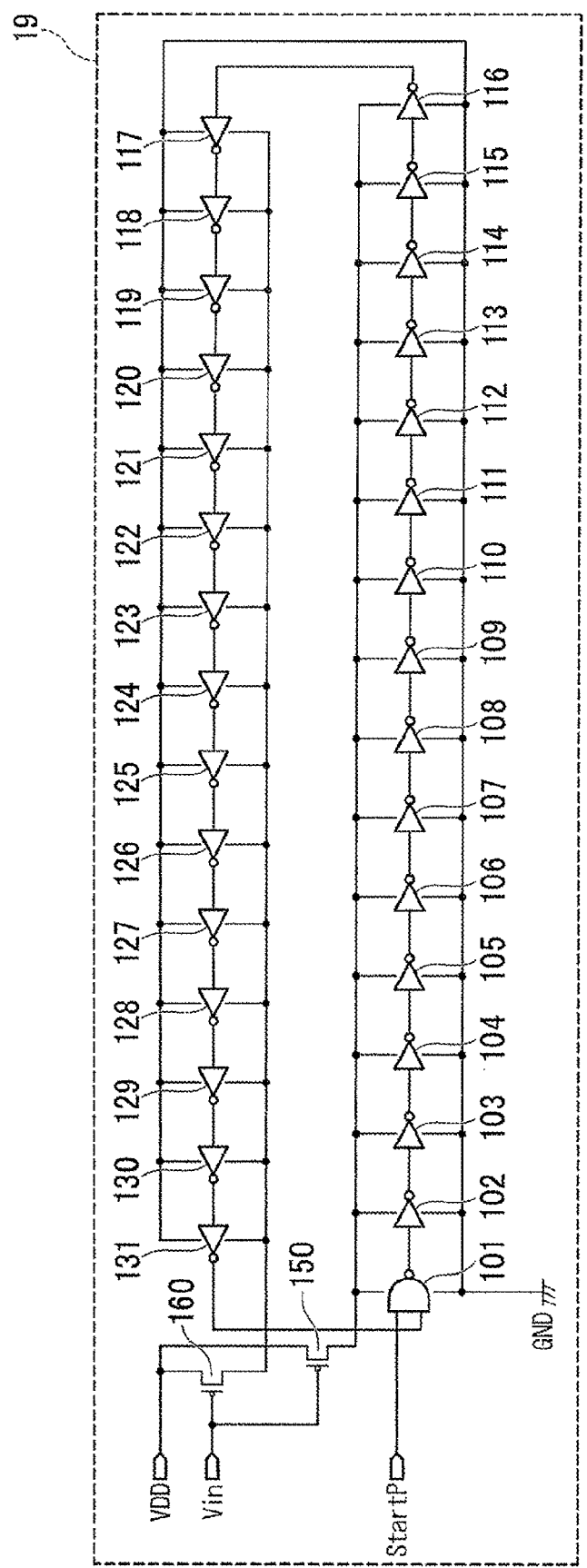
FIG. 1 is a diagram illustrating a pulse transit circuit of an analog-to-digital (A/D) converter circuit in accordance with a first preferred embodiment of the present invention.

A first preferred embodiment of the present invention will be described. FIG. 1 is a diagram illustrating a pulse transit circuit of an analog-to-digital (A/D) converter circuit in accordance with a first preferred embodiment of the present invention.

A pulse transit circuit 19 of the A/D converter circuit (time A/D converter) includes an annular delay circuit, a PMOS (Positive Metal Oxide Semiconductor) element 150, and a PMOS element 160.

The annular delay circuit includes a plurality of delay units (a NAND-type inverting circuit 101 and NOT-type inverting circuits 102 to 131). The NAND-type inverting circuit 101 and the NOT-type inverting circuits 102 to 131 are connected in an annular shape.

A ground terminal of the NAND-type inverting circuit 101 and ground terminals of the NOT-type inverting circuits 102 to 131 are connected to a ground voltage (GND).

A power supply terminal of the NAND-type inverting circuit 101 and power supply terminals of the NOT-type inverting circuits 102 to 116 are connected to a power supply voltage (VDD) via the PMOS element 150 (described later). On the other hand, the power supply terminals of the NOT-type inverting circuits 117 to 131 are connected to the power supply voltage via the PMOS element 160 (described later). An output terminal of the NOT-type inverting circuit 131 is connected to a counter (not shown in the figure).

To an input terminal of the NAND-type inverting circuit 101, a pulse signal (StartP) is input. This causes a pulse current to circulate around the annular delay circuit.

The counter (not shown in the figure) measures the number of circulations per predetermined period of time of the pulse current circulating around the annular delay circuit (generates a digital signal). The pulse current having circulated around the annular delay circuit is input to another input terminal of the NAND-type inverting circuit 101, and circulates again around the annular delay circuit. The output terminals of the inverting circuits 101 to 131 are connected to a latch & encoder (not shown in the figure).

The latch & encoder (not shown in the figure) measures a transit position of the pulse current circulating around the annular delay circuit. Here, the transit position is a position of a delay unit that is in the process of inverting the pulse current. The transit position is used as a fraction of the number of circulations of the pulse current.

As a result, a value resulting from an addition of a count value measured by the counter (not shown in the figure) (the number of circulations) to a transit position of the pulse current measured by the latch & encoder (not shown in the figure) (a fracture of the number of circulations) becomes a digital value in accordance with an analog input signal Vin.

The PMOS element 150 operates as a current control element (a current source) for restricting an electric current. That is, the PMOS element 150 outputs an electric current, in accordance with the analog input signal Vin input to its gate terminal, to the power supply terminal of the NAND-type inverting circuit 101 and the power supply terminals of the NOT-type inverting circuits 102 to 116 via its drain terminal Here, the analog input signal Vin is a voltage as a target of A/D conversion. To a source terminal of the PMOS element 150, a power supply voltage (VDD) is connected.

The PMOS element 160 operates as a current control element (a current source) for restricting an electric current. That is, the PMOS element 160 outputs an electric current, in accordance with the analog input signal Vin input to its gate terminal, to the power supply terminals of the NOT-type inverting circuits 117 to 131 via its drain terminal To a source terminal of the PMOS element 160, the power supply voltage is connected.

Next, an operation of the pulse transit circuit 19 will be described.

First, the PMOS element 150 outputs an electric current, in accordance with the analog input signal Vin input to its gate terminal, to the power supply terminal of the NAND-type inverting circuit 101 and the power supply terminals of the NOT-type inverting circuits 102 to 116 via its drain terminal. Similarly, the PMOS element 160 outputs an electric current, in accordance with the analog input signal Vin input to its gate terminal, to the power supply terminals of the NOT-type inverting circuits 117 to 131 via its drain terminal.

Next, to an input terminal of the NAND-type inverting circuit 101, a low-level pulse signal (StartP) is input from, for example, a signal read-out portion (not shown in the figure). This turns the output terminal of the NAND-type inverting circuit 101 to high level. Similarly, the output terminals of the NOT-type inverting circuits 102 to 131 are fixed to either high level or low level (inversion of high level) through inverting operations of the respective inverting circuits. Therefore, in this case, the pulse current does not circulate around the annular delay circuit.

Next, to the input terminal of the NAND-type inverting circuit 101, a high-level pulse signal (StartP) is input. The pulse current circulates around the annular delay circuit through the inverting operation of the NAND-type inverting circuit 101 and the inverting operations of the NOT-type inverting circuits 102 to 131. Due to the "current-delay time" characteristic, the propagation delay time of the pulse current is shorter as the electric current values supplied from the PMOS elements 150 and 160 are higher.

As described above, the PMOS element 150 (the current control element) outputs an electric current, in accordance with the input analog signal, to the power supply terminal of the NAND-type inverting circuit 101 and the power supply terminals of a series of NOT-type inverting circuits 102 to 116 that are selected from among the inverting circuits of the annular delay circuit. The PMOS element 160 (the current control element) outputs an electric current in accordance with the analog signal, which has been input, to the power supply terminals of a series of NOT-type inverting circuits 117 to 131 that are selected from among the inverting circuits of the annular delay circuit. Therefore, a single current control element is connected to a selected set of inverting circuits. This prevents upsizing of the pulse-delay-type A/D converter circuit.

The PMOS elements 150 and 160 restrict a through current in each inverting circuit, preventing perturbation of a pulse current. Therefore, the A/D converter circuit is capable of performing A/D conversion with accuracy based on the "current-delay time" characteristic.

The current control element may be made by use of an NMOS element. The current control element may be made by use of a combination of a PMOS element and an NMOS element.

The PMOS elements 150 and 160 (the current control elements) may output electric currents to a plurality of delay units that are not adjacent to each other, as will be described below.

Figure 2:
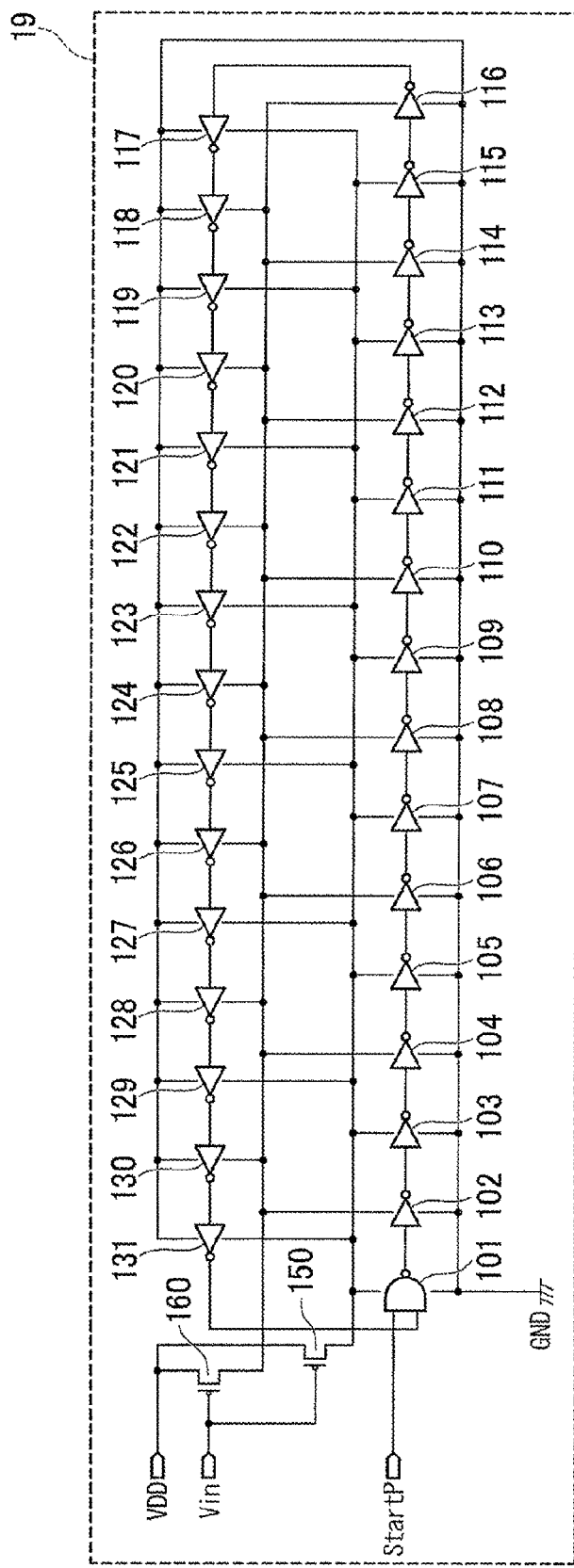
FIG. 2 is a diagram illustrating a modification of the pulse transit circuit of the analog-to-digital (A/D) converter circuit in accordance with the first preferred embodiment of the present invention.

FIG. 2 is a diagram illustrating a modification of the pulse transit circuit of the analog-to-digital (A/D) converter circuit. The PMOS element 150 outputs an electric current to the power supply terminal of the NAND-type inverting circuit 101 and the power supply terminals of odd-numbered NOT-type inverting circuits (103, 105, . . . , 131). On the other hand, the PMOS element 160 outputs an electric current to the power supply terminals of even-numbered NOT-type inverting circuits (102, 104, . . . , 130). Here, the even-numbered NOT-type inverting circuits and the odd-numbered NOT-type inverting circuits are connected in an alternating manner, and hence the inverting circuits of the same type are not adjacent to each other. However, the NAND-type inverting circuit 101 and the NOT-type inverting circuit 131 may be adjacent to each other.

With this structure, the electric current supplied to the power supply terminals of the NOT-type inverting circuits does not vary even when the NOT-type inverting circuit at their previous stage is still in the inverting operation (in the transition period), because the two power supply systems are separated. This prevents perturbation of the pulse current. Therefore, the A/D converter circuit is capable of performing A/D conversion with good accuracy based on the "current-delay time" characteristic.

Second Preferred Embodiment

A second preferred embodiment of the present invention will be described. A second preferred embodiment is different from the first preferred embodiment in that only a single current control element (a current source) is connected to the annular delay circuit of the pulse transit circuit. Only the differences from the first preferred embodiment will be described below.

Figure 3:
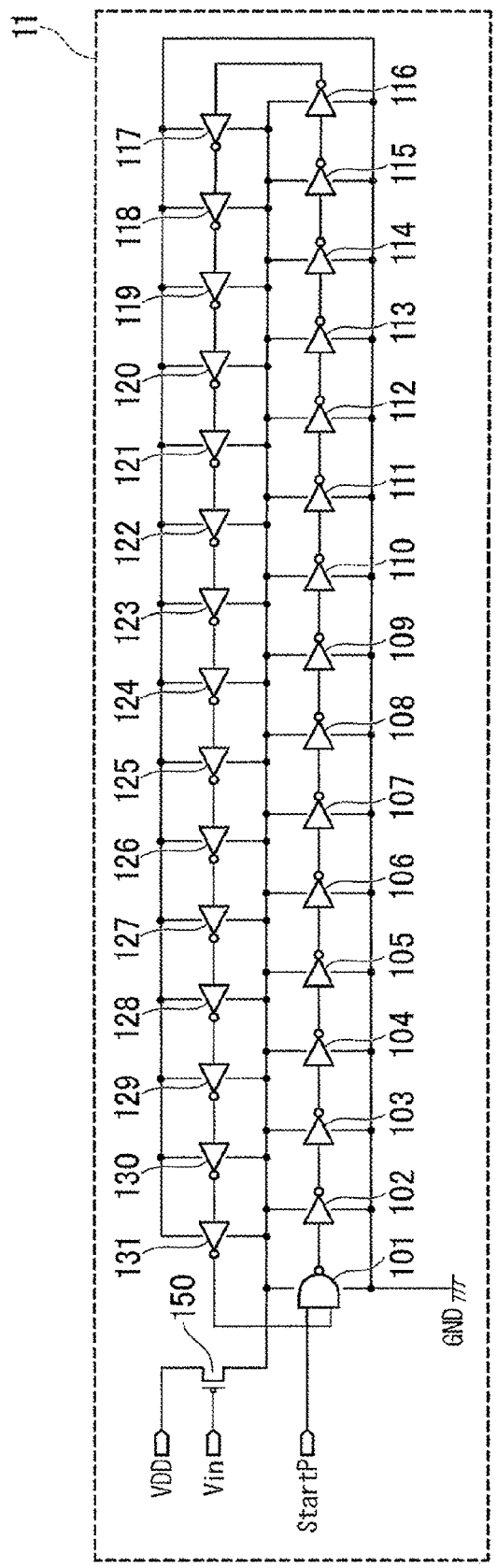
FIG. 3 is a diagram illustrating a pulse transit circuit of an analog-to-digital (A/D) converter circuit in accordance with a second preferred embodiment of the present invention.

FIG. 3 is a diagram illustrating a pulse transit circuit of an analog-to-digital (A/D) converter circuit in accordance with a second preferred embodiment of the present invention. A pulse transit circuit 11 of an A/D converter circuit includes: an annular delay circuit and a PMOS element 150. Here, the PMOS element 150 outputs an electric current, in accordance with an analog input signal Vin input to its gate terminal, to a power supply terminal of a NAND-type inverting circuit 101 and power supply terminals of NOT-type inverting circuits 102 to 131 via its drain terminal.

As described above, only a single current control element (the PMOS element 150) is connected to the annular delay circuit. Therefore, the number of the elements that constitute the pulse transit circuit is made smaller than that of the first preferred embodiment, to thereby make it possible to further downsize the circuit.

Furthermore, the current control element (the PMOS element 150) restricts a through current of each inverting circuit. This prevents perturbation of the pulse current. Therefore, the A/D converter circuit is capable of performing A/D conversion with good accuracy based on the "current-delay time" characteristic.

Third Preferred Embodiment

A third preferred embodiment of the present invention will be described. A third preferred embodiment is different from the second preferred embodiment in that the annular delay circuit is made of the same inverting circuits. Only the differences from the second preferred embodiment will be described below.

Figure 4:
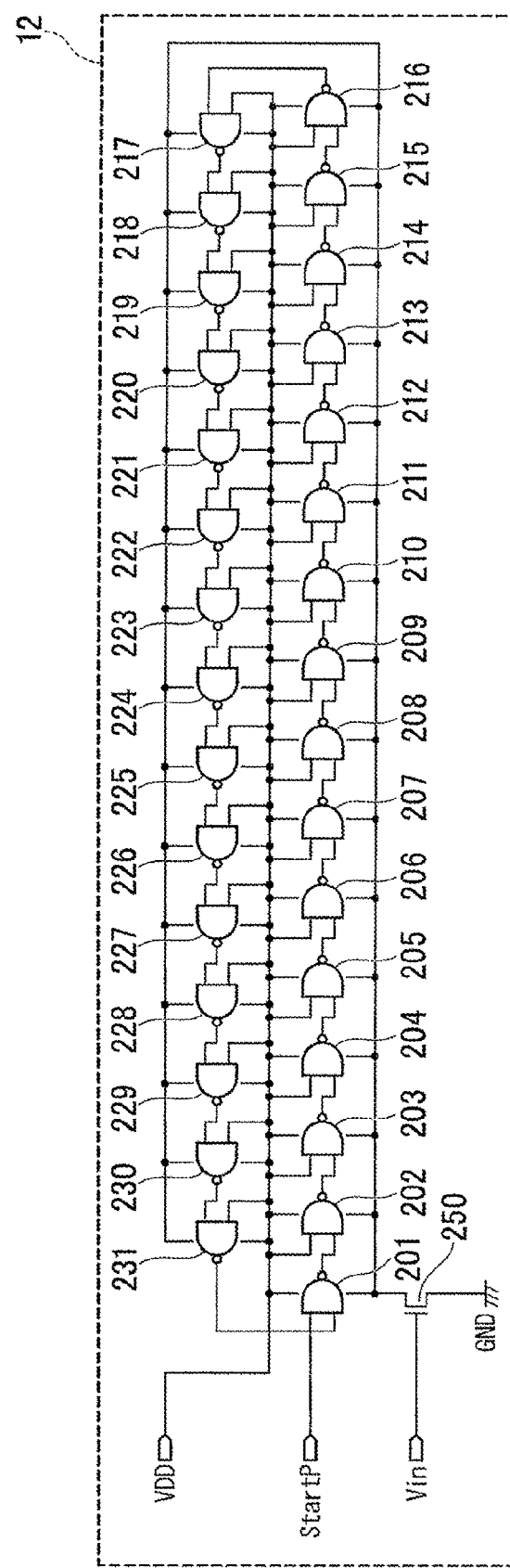
FIG. 4 is a diagram illustrating a pulse transit circuit of an analog-to-digital (A/D) converter circuit in accordance with a third preferred embodiment of the present invention.

The annular delay circuit may be made only of NAND-type inverting circuits. FIG. 4 is a diagram illustrating a pulse transit circuit of an analog-to-digital (A/D) converter circuit in accordance with the third preferred embodiment of the present invention. A pulse transit circuit 12 of an A/D converter circuit includes: an annular delay circuit; and an NMOS element 250. The annular delay circuit is made of a plurality of delay units (NAND-type inverting circuits 201 to 231). The NAND-type inverting circuits 201 to 231, which are connected in an annular shape, correspond to the NAND-type inverting circuit 101 and the NOT-type inverting circuits 102 to 131 of the second preferred embodiment (FIG. 3).

Ground terminals of the NAND-type inverting circuits 201 to 231 are connected to a ground voltage via the NMOS (Negative Metal Oxide Semiconductor) element 250. To power supply terminals of the NAND-type inverting circuits 201 to 231, a power supply voltage is connected.

The NMOS element 250 operates as a current control element (a current source) for restricting an electric circuit. That is, the NMOS element 250 outputs an electric current, in accordance with the analog input signal Vin input to the gate terminal, from its source terminal to the ground voltage. To a drain terminal of the NMOS element 250, the ground terminals of the NAND-type inverting circuits 202 to 231 are connected.

An output terminal of the NAND-type inverting circuit 231 is connected to a counter (not shown in the figure). A pulse signal (StartP) is input to an input terminal of the NAND-type inverting circuit 201. Output terminals of the NAND-type inverting circuits 201 to 231 are connected to a latch & encoder (not shown in the figure).

Even with this structure, the pulse current circulates around the pulse transit circuit 12.

The annular delay circuit may be made only of NOR-type inverting circuits.

Figure 5:
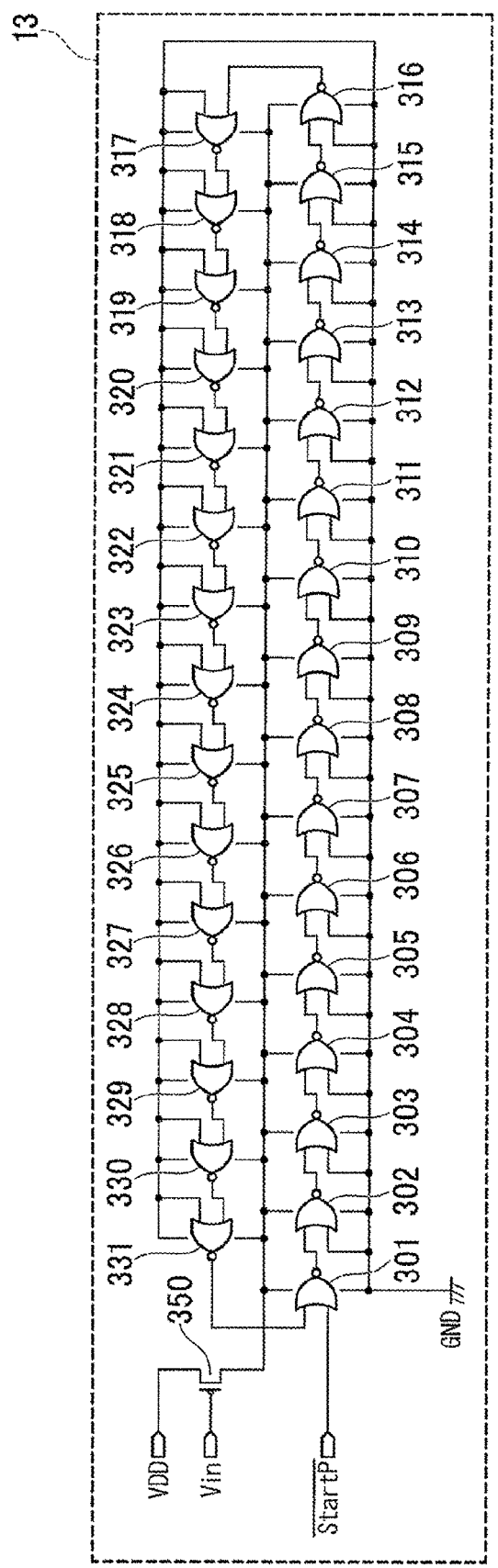
FIG. 5 is a diagram illustrating a modification of the pulse transit circuit of the analog-to-digital (A/D) converter circuit in accordance with the third preferred embodiment of the present invention.

FIG. 5 is a diagram illustrating a modification of the pulse transit circuit of the analog-to-digital (A/D) converter circuit in accordance with the third preferred embodiment of the present invention. A pulse transit circuit 13 of an A/D converter circuit includes: an annular delay circuit; and a PMOS element 350. The annular delay circuit is made of a plurality of delay units (NOR-type inverting circuits 301 to 331). The NOR-type inverting circuits 301 to 331, which are connected in an annular shape, correspond to the NAND-type inverting circuit 101 and the NOT-type inverting circuits 102 to 131 of the second preferred embodiment (FIG. 3).

Ground terminals of the NOR-type inverting circuits 301 to 331 are connected to a ground voltage.

The PMOS element 350 operates as a current control element (a current source) for restricting an electric current. That is, the PMOS element 350 outputs an electric current, in accordance with the analog input signal Vin input to the gate terminal, from its drain terminal To a source terminal of the PMOS element 350, a power supply voltage is connected. To the drain terminal of the PMOS element 350, power supply terminals of the NOR-type inverting circuits 301 to 331 are connected.

An output terminal of the NOR-type inverting circuit 331 is connected to a counter (not shown in the figure). Furthermore, an inverted pulse signal is input to the NOR-type inverting circuit 301. In addition, output terminals of the NOR-type inverting circuits 301 to 331 are connected to a latch & encoder (not shown in the figure).

As described above, the annular delay circuit of the pulse transit circuit 12 is made only of NAND-type inverting circuits. This reduces the variance in formation among inverting circuits and makes the times required for the inverting operations by the inverting circuits (the propagation delay times for the pulse current) equal. Therefore, A/D conversion accuracy improves on that of the second preferred embodiment. The same is true of the annular delay circuit of the pulse transit circuit 13.

Only a single current control element (the NMOS element 250 or the PMOS element 350) is connected to the annular delay circuit. Therefore, the number of the elements that constitute the pulse transit circuit is made smaller than that of the first preferred embodiment, to thereby make it possible to further downsize the circuit.

The NMOS element 250 or the PMOS element 350 restricts a through current of each inverting circuit. This prevents perturbation of the pulse current. Therefore, the A/D converter circuit is capable of performing A/D conversion with good accuracy based on the "current-delay time" characteristic.

Fourth Preferred Embodiment

A fourth preferred embodiment of the present invention will be described. A fourth preferred embodiment is different from the first to third preferred embodiments in that each delay unit is made of four transistors including PMOS elements and NMOS elements. Only the differences from the first to third preferred embodiments will be described below.

Figure 6:
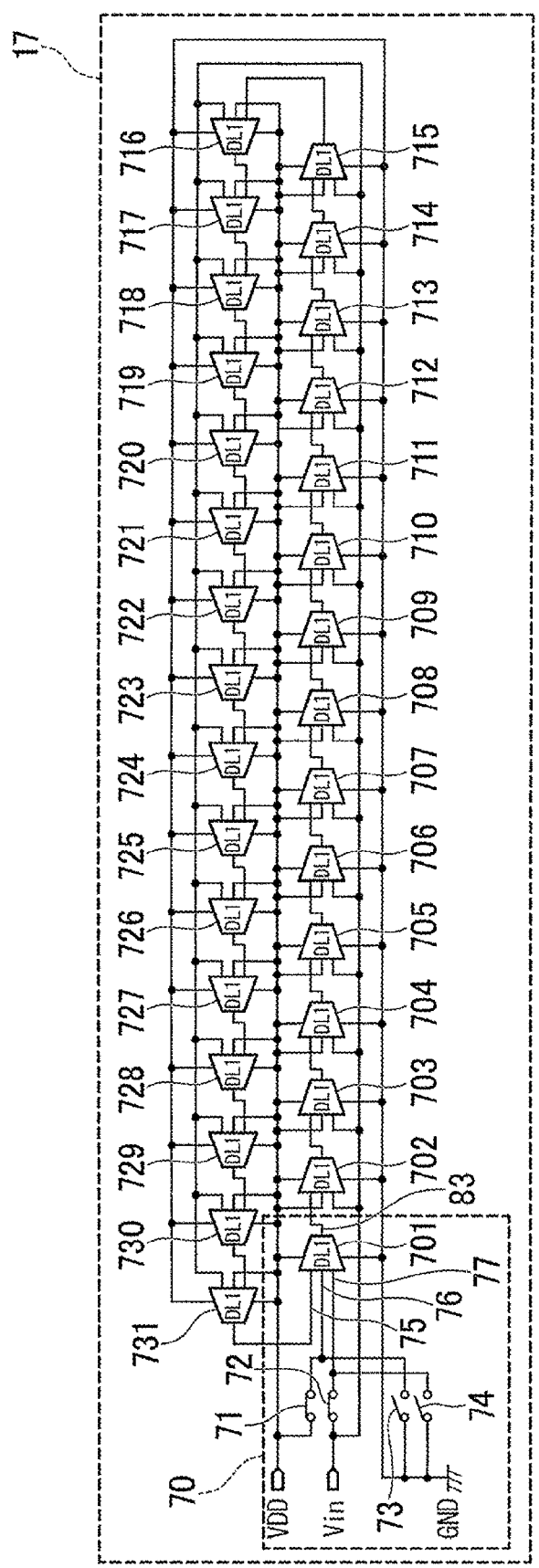
FIG. 6 is a diagram illustrating a pulse transit circuit of an analog-to-digital (A/D) converter circuit in accordance with a fourth preferred embodiment of the present invention.

FIG. 6 is a diagram illustrating a pulse transit circuit of an analog-to-digital (A/D) converter circuit in accordance with the fourth preferred embodiment of the present invention. A pulse transit circuit 17 of the A/D converter circuit includes: an annular delay circuit; and a switch portion 70. The switch portion 70 includes switches 71 to 74 (current control elements, current sources). The annular delay circuit includes 31 (an odd number not less than 3 of) delay units "DL1" (inverting circuits "DL1" 701 to 731). The inverting circuits "DL1" 701 to 731, which are connected in an annular shape, correspond to the NAND-type inverting circuit 101 and the NOT-type inverting circuits 102 to 131 of the second preferred embodiment (FIG. 3). FIG. 6 shows 31 delay units "DL1" by way of example.

To a first input terminal 75 of the inverting circuit "DL1" 701, an output terminal of the inverting circuit "DL1" 731 is connected. To a third input terminal 77 of the inverting circuit "DL1" 701, an analog input signal Vin is connected. To a power supply terminal of the inverting circuit "DL1" 701, a power supply voltage is connected. To a ground terminal of the inverting circuit "DL1" 701, a ground voltage is connected.

To a second input terminal 76 of the inverting circuit "DL1" 701, the power supply voltage is connected via the switch 71 if the switch 71 is ON. To the second input terminal 76 of the inverting circuit "DL1" 701, the ground voltage is connected via the switch 73 if the switch 73 is ON. Operations of the switches 71 to 74 will be described later with reference to FIG. 8.

To a first input terminal of the inverting circuit "DL1" 702, an output terminal 83 of the inverting circuit "DL1" 701 at the previous stage is connected. To a second input terminal of the inverting circuit "DL1" 702, the power supply voltage is connected.

To a third input terminal of the inverting circuit "DL1" 702, the analog input signal Vin is connected. To a power supply terminal of the inverting circuit "DL1" 702, the power supply voltage is connected. To a ground terminal of the inverting circuit "DL1" 702, the ground voltage is connected. The inverting circuits "DL1" 701 to 731 have the same structure.

Figure 7:
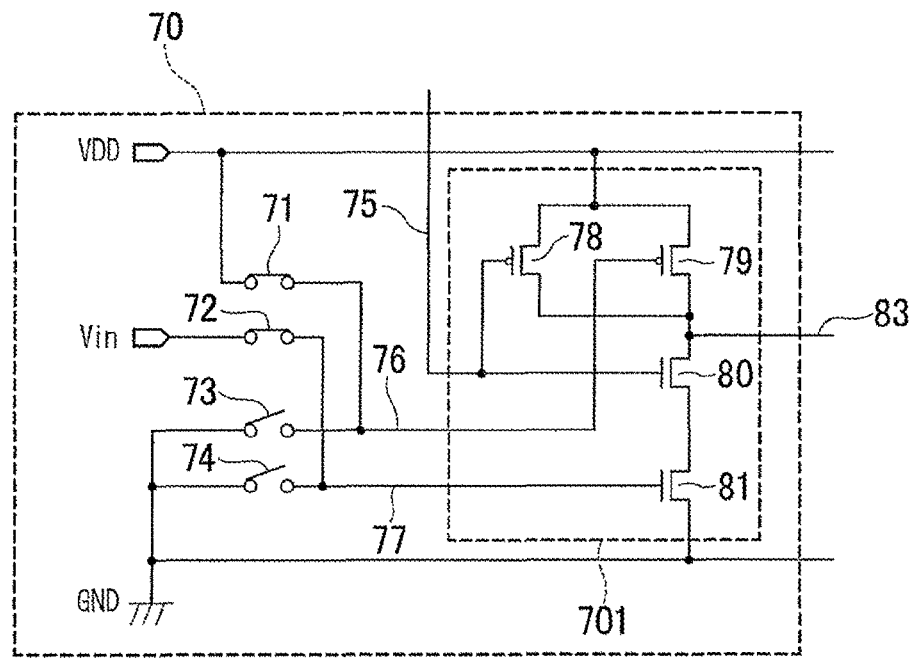
FIG. 7 is a diagram illustrating an example structure of the switches 71 to 74 and the inverting circuit "DL1" 701 of the pulse transit circuit 17 in accordance with the fourth preferred embodiment of the present invention.

FIG. 7 is a diagram illustrating an example structure of the switches 71 to 74 and the inverting circuit "DL1" 701 of the pulse transit circuit 17. The inverting circuit "DL1" 701 includes four transistors (a PMOS element 78, a PMOS element 79, an NMOS element 80, and an NMOS element 81). The PMOS elements 78 and 79 are connected in parallel between the power supply voltage and the output terminal 83. The NMOS elements 80 and 81 are connected in series between the ground voltage and the output terminal 83.

To gate terminals of the PMOS element 78 and the NMOS element 80, the first input terminal 75 of the inverting circuit "DL1" 701 is connected. To a gate terminal of the PMOS element 79, the second input terminal 76 of the inverting circuit "DL1" 701 is connected. To a gate terminal of the NMOS element 81, the third input terminal 77 of the inverting circuit "DL1" 701 is connected.

Figure 8:
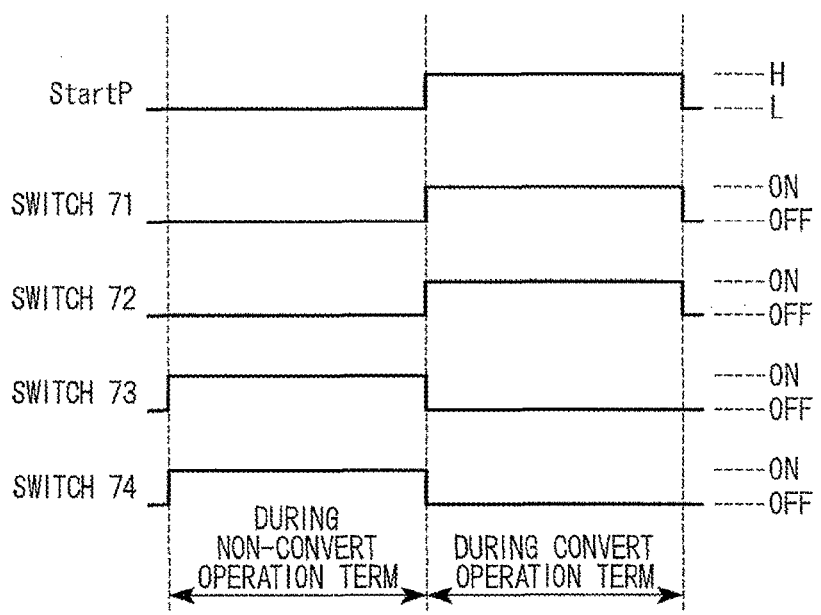
FIG. 8 is a diagram illustrating example operations of the switches 71 to 74 in accordance with the fourth preferred embodiment of the present invention.

FIG. 8 is a diagram illustrating example operations of the switches 71 to 74. The switches 71 to 74 are controlled by a control portion (not shown in the figure) according to the pulse signal (StartP).

First, in a non-covert operation term (a term in which the pulse signal is at a low level (L)) in which the analog input signal Vin is not in the process of A/D conversion, the control portion (not shown in the figure) sets the switches 71 and 72 to disabled (OFF) and sets the switches 73 and 74 to enabled (ON). This connects the second input terminal 76 to the ground voltage, turning the PMOS element 79 to enabled. Furthermore, the third input terminal 77 is connected to the ground voltage, turning the NMOS element 81 to disabled.

Consequently, the output terminal 83 of the inverting circuit "DL1" 701 is at a high level. Furthermore, output terminals of the inverting circuits "DL1" 702 to 731 are fixed to either a high level or a low level through inverting operations of the respective inverting circuits. This prevents the pulse current from circulating around the annular delay circuit.

Next, in a covert operation term (a term in which the pulse signal is at a high level (H)) in which the analog input signal Vin is in the process of A/D conversion, the control portion (not shown in the figure) sets the switches 71 and 72 to enabled (ON) and sets the switches 73 and 74 to disabled (OFF). This connects the second input terminal 76 of the inverting circuit "DL1" 701 to the power supply voltage, turning the PMOS element 79 to disabled. Furthermore, the NMOS element 81 outputs an electric current in accordance with the analog input signal Vin.

Consequently, the inverting circuits "DL1" 701 to 731 are driven with the electric current in accordance with the analog input signal Vin. This causes each of the inverting circuits "DL1" 701 to 731 to perform an inverting operation. Therefore, the pulse current circulates around the annular delay circuit.

As a result, a value resulting from an addition of a count value measured by a counter (not shown in the figure) (the number of circulations) to a transit position of the pulse current measured by the latch & encoder (not shown in the figure) (a fracture of the number of circulations) becomes a digital value in accordance with an analog input signal Vin.

As described above, the inverting circuits "DL1" (the delay units) 701 to 731 each include the same structure with four transistors (MOS transistors). Inclusion of the same structure makes the variance in formation among the inverting circuits "DL1" small. This makes the number of times required for the inverting operations by the inverting circuits "DL1" (the propagation delay times for the pulse current) equal. Therefore, A/D conversion accuracy improves on that of the second preferred embodiment.

Furthermore, compared with the case where current control elements (current sources) are connected to the delay units of the annular delay circuit on a one-to-one basis, the number of the elements that constitute the pulse transit circuit is made smaller. Therefore, it is possible to downsize the circuit.

Furthermore, a through current of each inverting circuit "DL1" is restricted. This prevents perturbation of the pulse current. Therefore, the A/D converter circuit is capable of performing A/D conversion with good accuracy based on the "current-delay time" characteristic.

Fifth Preferred Embodiment

A fifth preferred embodiment of the present invention will be described. A fifth preferred embodiment is different from the fourth preferred embodiment in that the number of inverting circuits "DL1" (delay units) is even. Furthermore, the fifth preferred embodiment is different from the fourth preferred embodiment in that a feedforward circuit and another inverting circuit "DL1" are added to the pulse transit circuit. Only the differences from the fourth preferred embodiment will be described below.

Figure 9:
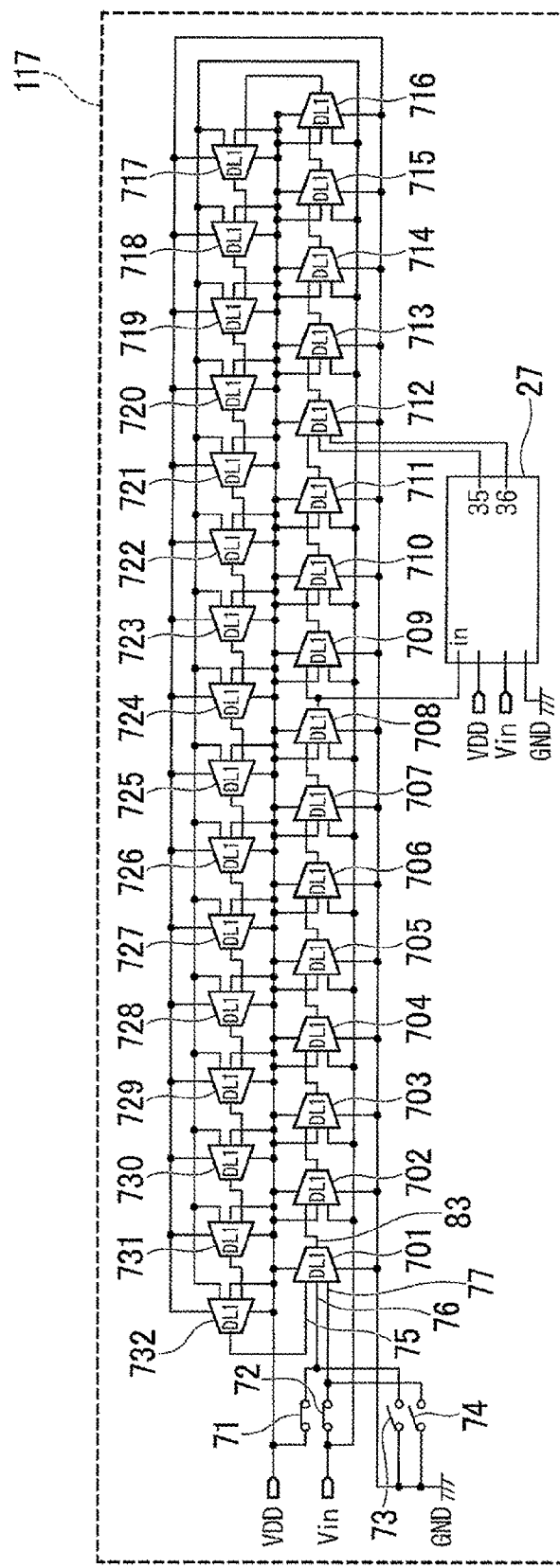
FIG. 9 is a diagram illustrating a pulse transit circuit of an analog-to-digital (A/D) converter circuit in accordance with a fifth preferred embodiment of the present invention.

FIG. 9 is a diagram illustrating a pulse transit circuit of an analog-to-digital (A/D) converter circuit in accordance with the fifth preferred embodiment of the present invention. A pulse transit circuit 117 includes: an annular delay circuit; and switch 71 to switch 74 (current control elements, current sources). The annular delay circuit includes: a feedforward circuit 27; and an even number of delay units "DL1" (inverting circuits "DL1" 701 to 732). The delay units "DL1" are connected in an annular shape. FIG. 9 shows 32 delay units "DL1" by way of example.

With a pulse current circulating around the annular delay circuit being input from the inverting circuit "DL1" 708, the feedforward circuit 27 outputs a high-level or low-level voltage to the inverting circuit "DL1" 712.

Figure 10A:
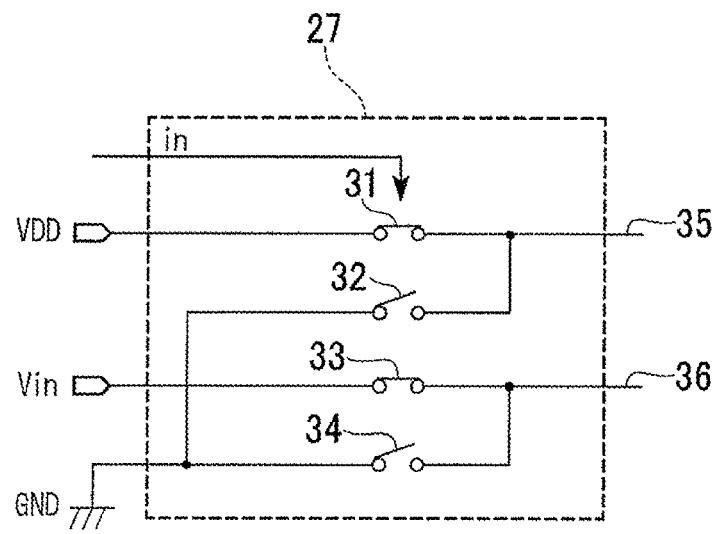
FIG. 10A is a diagram illustrating an example structure of the feedforward circuit 27 in accordance with the fifth preferred embodiment of the present invention.

FIG. 10A is a diagram illustrating an example structure of the feedforward circuit 27. The feedforward circuit 27 includes switches 31 to 34. To the feedforward circuit 27, a pulse current "in" output from the inverting circuit "DL1" 708 is input. In accordance with the pulse current "in," the feedforward circuit 27 controls the switches 31 to 34.

To a first output terminal 35, a power supply voltage is connected via the switch 31, a ground voltage is connected via the switch 32, and a second input terminal of the inverting circuit "DL1" 712 is connected. To a second output terminal 36, a power supply voltage is connected via the switch 33, the ground voltage is connected via the switch 34, and a third input terminal of the inverting circuit "DL1" 712 is connected.

Figure 10B:
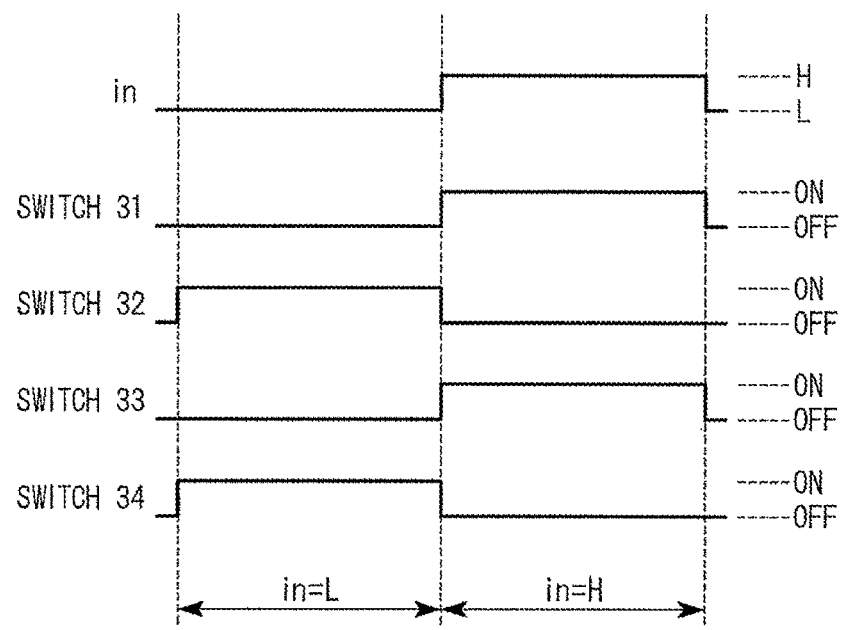
FIG. 10B is a diagram illustrating example operations of the switches of the feedforward circuit 27 in accordance with the fifth preferred embodiment of the present invention.

FIG. 10B is a diagram illustrating example operations of the switches of the feedforward circuit 27. Here, an input terminal "in" for a pulse current is connected to an output terminal of the inverting circuit "DL1" 708. If the input terminal "in" of the pulse current is at a low level, the feedforward circuit 27 sets the switch 31 to disabled (OFF), the switch 32 to enabled (ON), the switch 33 to disabled (OFF), and the switch 34 to enabled (ON). Therefore, the first output terminal 35 (the second input terminal of the inverting circuit "DL1" 712) has the ground voltage. The second output terminal 36 (the third input terminal of the inverting circuit "DL1" 712) also has the ground voltage.

On the other hand, if the input terminal "in" of the pulse current is at a high level, the feedforward circuit 27 sets the switch 31 to enabled (ON), the switch 32 to disabled (OFF), the switch 33 to enabled (ON), and the switch 34 to disabled (OFF). Therefore, the first output terminal 35 (the second input terminal of the inverting circuit "DL1" 712) has the power supply voltage. To the second output terminal 36, an analog input signal Vin is input. The input analog input signal Vin is then output to the third input terminal of the inverting circuit "DL1" 712.

In FIG. 9, the inverting circuit "DL1" 708 outputs the pulse current. The pulse current is then input to the inverting circuit "DL1" 712 via the feedforward circuit 27. Therefore, even if the number of the inverting circuits "DL1" (the delay units) is even, the outputs of the inverting circuits "DL1" are not fixed to either a high level or a low level. Consequently, the pulse current travels around the annular delay circuit.

As described above, with the feedforward circuit 27 being provided in the annular delay circuit, it is possible to obtain an even number of "transit positions of the pulse current." Therefore, the A/D-converted values are suitable for digital processing in which they are processed as binary numbers.

The inverting circuits "DL1" (the delay units) 701 to 732 have the same structure with four transistors (MOS transistors). The same structure reduces the variance in formation among the inverting circuits "DL1" and makes the times required for the inverting operations by the inverting circuits "DL1" (the propagation delay times for the pulse current) equal. Therefore, A/D conversion accuracy improves on that of the second preferred embodiment.

Furthermore, compared with the case where current control elements (power supplies) are connected to the delay units of the annular delay circuit on a one-to-one basis, the number of the elements that constitute the pulse transit circuit is made smaller. Therefore, it is possible to downsize the circuit.

Furthermore, a through current of each inverting circuit "DL1" is restricted. This prevents perturbation of the pulse current. Therefore, the A/D converter circuit is capable of performing A/D conversion with good accuracy based on the "current-delay time" characteristic.

Sixth Preferred Embodiment

A sixth preferred embodiment of the present invention will be described. A sixth preferred embodiment is different from the fourth preferred embodiment only in the structure of the inverting circuits (the delay units). Only the differences from the fourth preferred embodiment will be described below.

Figure 11:
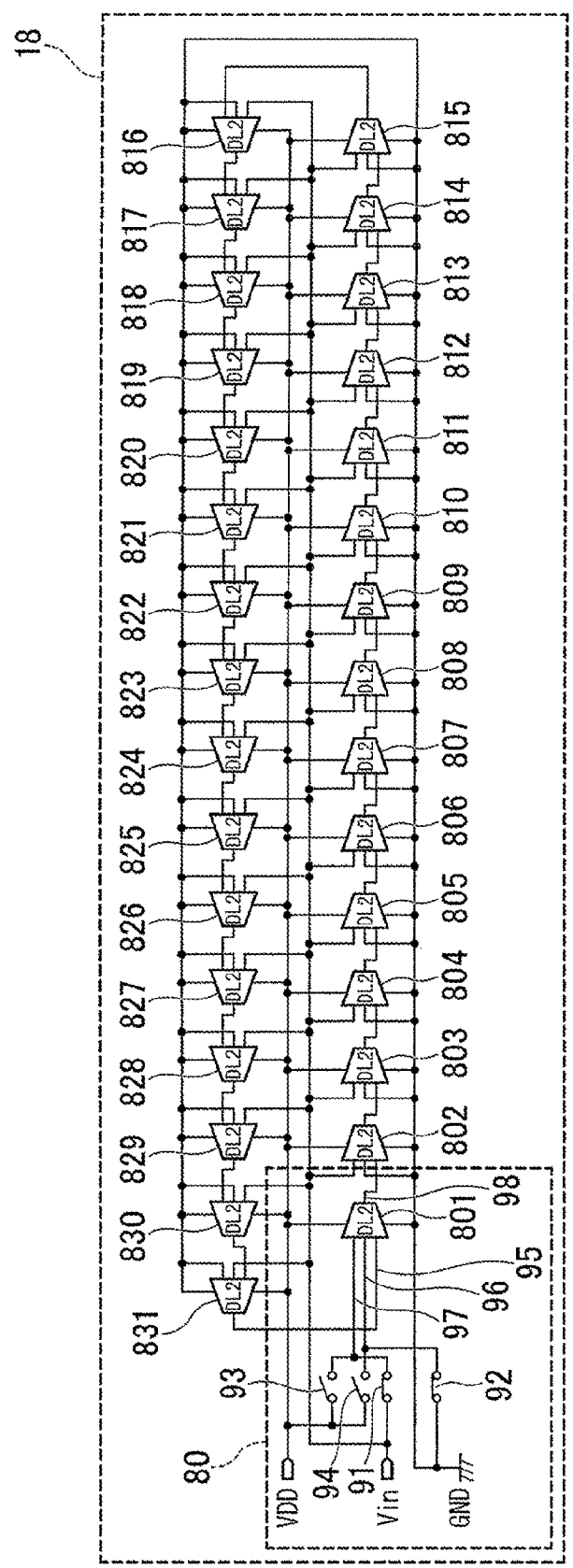
FIG. 11 is a diagram illustrating a pulse transit circuit of an analog-to-digital (A/D) converter circuit in accordance with a sixth preferred embodiment of the present invention.

FIG. 11 is a diagram illustrating a pulse transit circuit of an analog-to-digital (A/D) converter circuit in accordance with the sixth preferred embodiment of the present invention. A pulse transit circuit 18 includes: an annular delay circuit; and a switch portion 80. The switch portion 80 includes switch 91 to switch 94 (current control elements, current sources). The annular delay circuit includes 31 (an odd number not less than 3 of) delay units "DL2" (inverting circuits "DL2" 801 to 831). The inverting circuits "DL2" 801 to 831, which are connected in an annular shape, correspond to the NAND-type inverting circuit 101 and the NOT-type inverting circuits 102 to 131 of the second preferred embodiment (FIG. 3). FIG. 11 shows 31 delay units "DL2" by way of example.

To a first input terminal 95 of the inverting circuit "DL2" 801, an output terminal of the inverting circuit "DL2" 831 is connected. To a second input terminal 96 of the inverting circuit "DL2" 801, a power supply voltage is connected via the switch 94, and a ground voltage is connected via the switch 92. To a third input terminal 97 of the inverting circuit "DL2" 801, the power supply voltage is connected via the switch 93, and an analog input signal Vin is connected via the switch 91. To a power supply terminal of the inverting circuit "DL2" 801, the power supply voltage is connected. To a ground terminal of the inverting circuit "DL2" 801, the ground voltage is connected.

To a first input terminal of the inverting circuit "DL2" 802, an output terminal 98 of the inverting circuit "DL2" 801 at the previous stage is connected. To a second input terminal of the inverting circuit "DL2" 802, the ground voltage is connected. To a third input terminal of the inverting circuit "DL2" 802, the power supply voltage is connected. To a power supply terminal of the inverting circuit "DL2" 802, the power supply voltage is connected. To a ground terminal of the inverting circuit "DL2" 802, the ground voltage is connected. The inverting circuits "DL2" 801 to 831 have the same structure.

Figure 12:
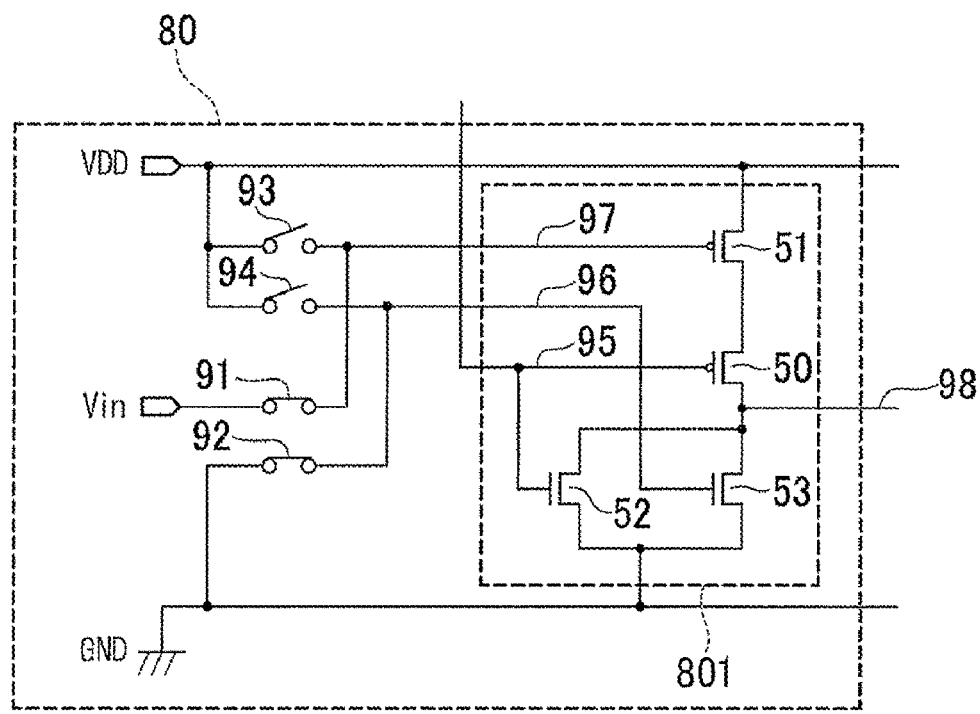
FIG. 12 is a diagram illustrating an example structure of the switches 91 to 94 and the inverting circuit "DL2" 801 of the pulse transit circuit 18 in accordance with the sixth preferred embodiment of the present invention.

FIG. 12 is a diagram illustrating an example structure of the switches 91 to 94 and the inverting circuit "DL2" 801 of the pulse transit circuit 18. The inverting circuit "DL2" 801 includes four transistors (a PMOS element 50, a PMOS element 51, an NMOS element 52, and an NMOS element 53). The PMOS elements 50 and 51 are connected in series between the power supply voltage and the output terminal 98. The NMOS elements 52 and 53 are connected in parallel between the ground voltage and the output terminal 98.

To gate terminals of the PMOS element 50 and the NMOS element 52, the first input terminal 95 of the inverting circuit "DL2" 801 is connected. To the gate terminal of the NMOS element 53, the second input terminal 96 of the inverting circuit "DL2" 801 is connected. To the gate terminal of the PMOS element 51, the third input terminal 97 of the inverting circuit "DL2" 801 is connected.

Next, example operations of the switches 91 to 94 will be described.

The switches 91 to 94 are controlled by a control portion (not shown in the figure) according to a pulse signal (StartP).

First, in a non-covert operation term (a term in which the pulse signal is at a low level (L)) in which the analog input signal Vin is not in the process of A/D-conversion, the control portion (not shown in the figure) sets the switches 91 and 92 to disabled (OFF), and sets the switches 93 and 94 to enabled (ON). This connects the second input terminal 96 of the inverting circuit "DL2" 801 to the power supply voltage, turning the NMOS element 53 to enabled. The third input terminal 97 is connected to the power supply voltage, turning the PMOS element 51 to disabled.

Consequently, the output terminal 98 of the inverting circuit "DL2" 801 is at a low level. Furthermore, output terminals of the inverting circuits "DL2" 802 to 831 are fixed to either a high level or a low level through inverting operations of the respective inverting circuits. Therefore, the pulse current does not circulate around the annular delay circuit.

Next, in a covert operation term (a term in which the pulse signal is at a high level (H)) in which the analog input signal Vin is in the process of A/D-conversion, the control portion (not shown in the figure) sets the switches 91 and 92 to enabled (ON), and sets the switches 93 and the 94 to disabled (OFF). This connects the second input terminal 96 of the inverting circuit "DL2" 801 to the ground voltage, turning the NMOS element 53 to disabled. The PMOS element 51 outputs an electric current in accordance with the analog input signal Vin.

Consequently, the inverting circuits "DL2" 801 to 831 are driven with the electric current in accordance with the analog input signal Vin. This causes each of the inverting circuits "DL2" 801 to 831 to perform an inverting operation. Therefore, the pulse current circulates around the annular delay circuit.

As a result, a value resulting from an addition of a count value measured by a counter (not shown in the figure) (the number of circulations) to a transit position of the pulse current measured by the latch & encoder (not shown in the figure) (a fracture of the number of circulations) becomes a digital value in accordance with an analog input signal Vin.

As described above the inverting circuits "DL2" (the delay units) 801 to 832 each include the same structure with four transistors (MOS transistors). Inclusion of the same structure makes the variance in formation among the inverting circuits "DL2" small. This makes the times required for the inverting operations by the inverting circuits "DL2" (the propagation delay times for the pulse current) equal. Therefore, A/D conversion accuracy improves on that of the second preferred embodiment.

Furthermore, compared with the case where current control elements (current sources) are connected to the delay units of the annular delay circuit on a one-to-one basis, the number of the elements that constitute the pulse transit circuit is made smaller. Therefore, it is possible to downsize the circuit.

Furthermore, a through current of each inverting circuit "DL2" is restricted. This prevents perturbation of the pulse current. Therefore, the A/D converter circuit is capable of performing A/D conversion with good accuracy based on the "current-delay time" characteristic.

Seventh Preferred Embodiment

A seventh preferred embodiment of the present invention will be described. A seventh preferred embodiment is different from the fifth preferred embodiment in that the number of inverting circuits "DL2" (delay units) is even. Furthermore, the seventh preferred embodiment is different from the sixth preferred embodiment in that a feedforward circuit and another inverting circuit "DL2" are added to the pulse transit circuit. Only the differences from the sixth preferred embodiment will be described below.

Figure 13:
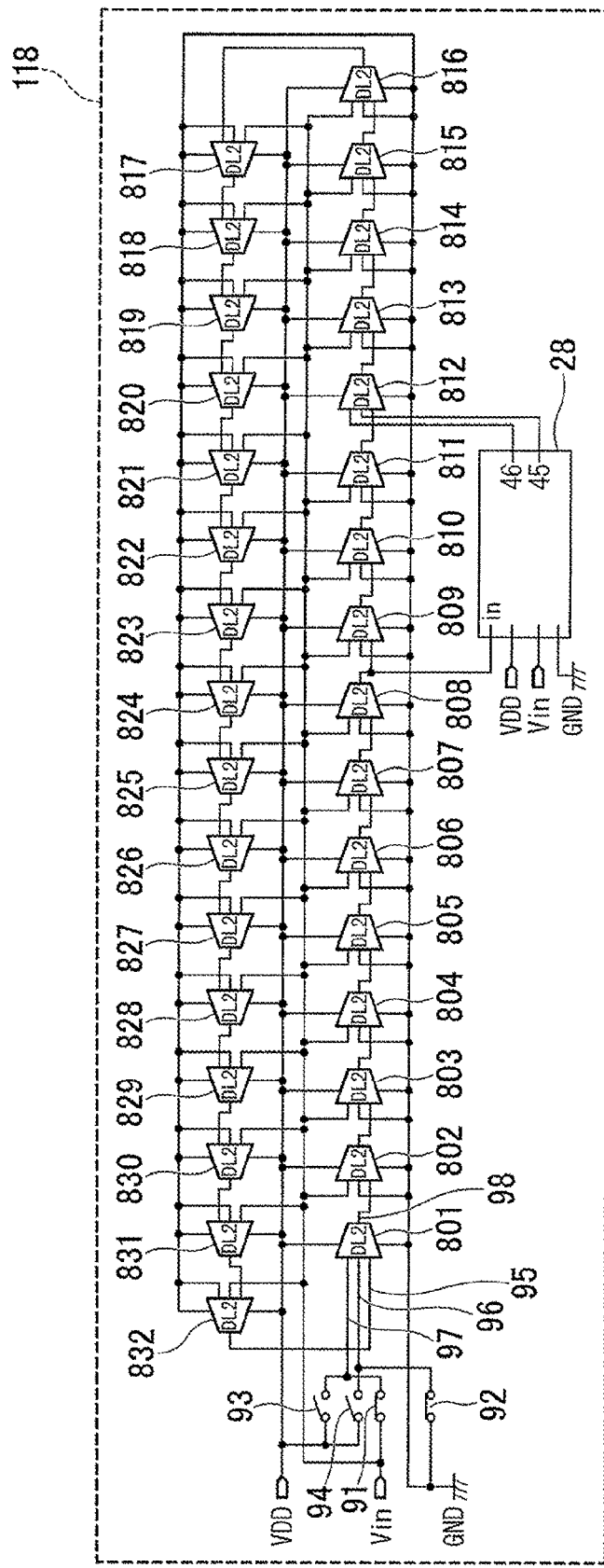
FIG. 13 is a diagram illustrating a pulse transit circuit of an analog-to-digital (A/D) converter circuit in accordance with a seventh preferred embodiment of the present invention.

FIG. 13 is a diagram illustrating a pulse transit circuit of an analog-to-digital (A/D) converter circuit in accordance with the seventh preferred embodiment of the present invention. A pulse transit circuit 118 includes: an annular delay circuit; and switches 91 to 94 (current control elements, current sources). The annular delay circuit includes: a feedforward circuit 28; and 32 (an even number of) delay units "DL2" (inverting circuits "DL2" 801 to 832). The delay units "DL2" are connected in an annular shape. FIG. 13 shows 32 delay units "DL2" by way of example.

With a pulse current circulating around the annular delay circuit being input from the inverting circuit "DL2" 808, the feedforward circuit 28 outputs a high-level or low-level pulse current to the inverting circuit "DL2" 812.

Figure 14A:
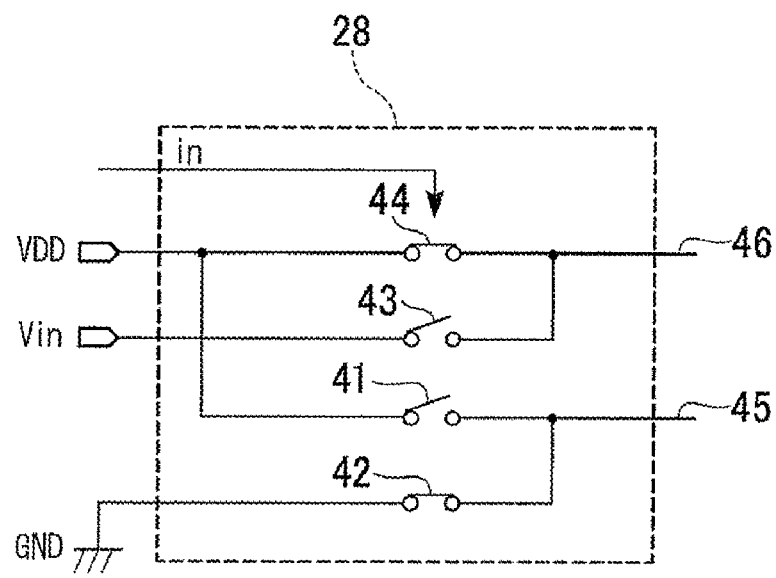
FIG. 14A is a diagram illustrating an example structure of the feedforward circuit 28 in accordance with the seventh preferred embodiment of the present invention.

FIG. 14A is a diagram illustrating an example structure of the feedforward circuit 28. The feedforward circuit 28 includes switches 41 to 44. To the feedforward circuit 28, a pulse current "in" output from the inverting circuit "DL2" 808 is input. In accordance with the pulse current "in," the feedforward circuit 28 controls the switches 41 to 44.

To a first output terminal 45, a power supply voltage is connected via the switch 41, a ground voltage is connected via the switch 42, and a second input terminal of the inverting circuit "DL2" 812 is connected. To a second output terminal 46, a power supply voltage is connected via the switch 43, the ground voltage is connected via the switch 44, and a third input terminal of the inverting circuit "DL2" 812 is connected.

Figure 14B:
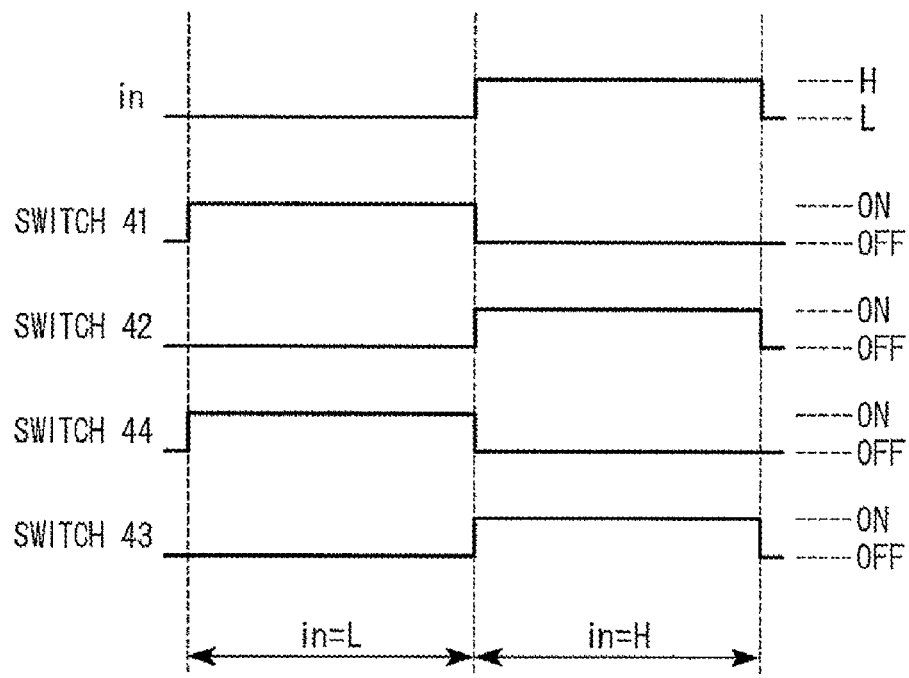
FIG. 14B is a diagram illustrating example operations of the switches of the feedforward circuit 28 in accordance with the seventh preferred embodiment of the present invention.

FIG. 14B is a diagram illustrating example operations of the switches of the feedforward circuit 28. An input terminal "in" for a pulse current is connected to an output terminal of the inverting circuit "DL2" 808. If the input terminal "in" for the pulse current is at a low level, the feedforward circuit 28 sets the switch 41 to enabled (ON), the switch 42 to disabled (OFF), the switch 43 to enabled (ON), and the switch 44 to disabled (OFF). Therefore, the first output terminal 45 (the second input terminal of the inverting circuit "DL2" 812) has the power supply voltage. To the second output terminal 46, an analog input signal Vin is input. The input analog input signal Vin is then output to the third input terminal of the inverting circuit "DL2" 812.

In FIG. 13, the inverting circuit "DL2" 808 outputs the pulse current. The pulse current is then input to the inverting circuit "DL2" 812 via the feedforward circuit 28. Therefore, even if the number of the inverting circuits "DL2" (the delay units) of the annular delay circuit is even, the outputs of the inverting circuits "DL2" are not fixed to either a high level or a low level. Consequently, the pulse current is capable of traveling around the annular delay circuit.

As described above, with the feedforward circuit 28 being provided in the annular delay circuit, it is possible to obtain an even number of "transit positions of the pulse current" from the inverting circuits "DL2". Therefore, the A/D-converted values are suitable for digital processing in which they are processed as binary numbers.

Furthermore, the inverting circuits "DL2" (the delay units) 801 to 832 have the same structure with four transistors (MOS transistors). The same structure reduces the variance in formation among the inverting circuits "DL2" and makes the times required for the inverting operations by the inverting circuits "DL2" (the propagation delay times for the pulse current) equal. Therefore, A/D conversion accuracy improves on that of the second preferred embodiment.

Furthermore, compared with the case where current control elements (power supplies) are connected to the inverting circuits "DL2" of the annular delay circuit on a one-to-one basis, the number of the elements that constitute the pulse transit circuit is made smaller. Therefore, it is possible to downsize the circuit.

Furthermore, a through current of each inverting circuit "DL2" is restricted. This prevents perturbation of the pulse current. Therefore, the A/D converter circuit is capable of performing A/D conversion with good accuracy based on the "current-delay time" characteristic.

As described above, according to the preferred embodiments of the present invention, the current source of the pulse-delay-type A/D converter circuit outputs an electric current, in accordance with the input analog signal, to some delay units selected from among a plurality of delay units. Therefore, the pulse-delay-type A/D converter circuit is capable of performing an A/D conversion with good accuracy based on the "current-delay time" characteristic without making the circuit size larger.

While preferred embodiments of the present invention have been described and illustrated above, it should be understood that these are examples of the present invention and are not to be considered as limiting. Additions, omissions, substitutions, and other modifications can be made without departing from the scope of the present invention.

For example, the A/D converter circuit may include a plurality of pulse transit circuits, and may calculate an average of the number of circulations of the pulse current that circulate around the circuits. Alternatively, the A/D converter circuit may calculate an average time for the circulations of the pulse currents.

Furthermore, for example, the current control element (the current source) may be connected to both the power supply terminal and the ground terminal of each inverting circuit.

Furthermore, for example, the analog input signal Vin may be a voltage output from a pixel (not shown in the figure) of an image pickup apparatus (not shown in the figure).

Furthermore, for example, the current control element (the current source) may be provided in each column of a TAD imager. In this case, it is possible to correct a variance in A/D conversion results for the columns on a column-by column basis.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," "nearly", and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

The term "unit" is used to describe a component, section or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accord-

What is claimed is:

1. An analog-to-digital converter comprising:
   an annular delay circuit that includes a plurality of delay units connected in an annular shape, each of the plurality of delay units delaying a pulse current that is input to each of the plurality of delay units;
   a first current source that outputs an electric current, in accordance with an input analog signal, to first delay units
   a second current source that outputs the electric current, in accordance with the input analog signal, to second delay units; and
   a digital signal generation unit that generates a digital signal in accordance with a number of circulations per predetermined period of time of the pulse current circulating around the annular delay circuit,
   wherein the plurality of delay units includes the first delay units and the second delay units, and
   wherein each of the first delay units and each of the second delay units are not adjacent to each other.

2. The analog-to-digital converter according to claim 1, wherein the annular delay circuit includes a plurality of delay circuits, each of the plurality of delay circuits includes one of the plurality of delay units and the current source, and each of the plurality of delay circuits is made of four transistors.

3. An analog-to-digital converter, comprising:
   an annular delay circuit that includes a plurality of delay units connected in an annular shape, each of the plurality of delay units delaying a pulse current that is input to each of the plurality of delay units;
   a current source that outputs an electric current, in accordance with an input analog signal, to first delay units, wherein the plurality of delay units includes the first delay units; and'
   a digital signal generation unit that generates a digital signal in accordance with a number of circulations per predetermined period of time of the pulse current circulating around the annular delay circuit,
   wherein
   the plurality of delay units includes a first plurality of delay units and a second plurality of delay units,
   the current source includes a first PMOS element and a second PMOS element,
   the first PMOS element outputs a first current to the first plurality of delay units, and
   the second PMOS element outputs a second current to the second plurality of delay units.

4. An analog-to-digital converter comprising:
   an annular delay circuit that includes a plurality of delay units connected in an annular shape, each of the plurality of delay units delaying a pulse current that is input to each of the plurality of delay units;
   a current source that outputs an electric current, in accordance with an input analog signal, to first delay units, wherein the plurality of delay units includes the first delay units; and
   a digital signal generation unit that generates a digital signal in accordance with a number of circulations per predetermined period of time of the pulse current circulating around the annular delay circuit,
   wherein
   the plurality of delay units includes a first plurality of delay units and a second plurality of delay units,
   the current source includes a PMOS element and an NMOS element,
   the PMOS element outputs a first current to the first plurality of delay units, and
   the NMOS element outputs a second current to the second plurality of delay units.

5. An analog-to-digital conversion method comprising:
   outputting an electric current, in accordance with an input analog signal, from a first current source to a first delay units included in a plurality of delay units included in an annular delay circuit;
   outputting the electric current, in accordance with the input analog signal, from a second current source to a second delay units included in the plurality of delay units included in the annular delay circuit and
   generating a digital signal in accordance with a number of circulations per predetermined period of time of the pulse current circulating around the annular delay circuit
   wherein each of the first delay units and each of the second delay units are not adjacent to each other.

* * * * *

UNITED STATES PATENT AND TRADEMARK OFFICE
CERTIFICATE OF CORRECTION

PATENT NO. : 8,284,092 B2
APPLICATION NO. : 12/892163
DATED : October 9, 2012
INVENTOR(S) : Yusaku Koyama et al.

It is certified that error appears in the above-identified patent and that said Letters Patent is hereby corrected as shown below:

In Item (73):
Change

"(73)    Assignee:    Olympus Corporation, Tokyo (JP)"

To be

--(73)    Assignee:    Olympus Corporation, Tokyo (JP)
                       Denso Corporation, Kariya-shi, Aichi-ken (JP)--

Signed and Sealed this
Ninth Day of April, 2013

Teresa Stanek Rea
*Acting Director of the United States Patent and Trademark Office*